(12) United States Patent
Ye et al.

(10) Patent No.: US 8,101,699 B2
(45) Date of Patent: Jan. 24, 2012

(54) ELECTRON-TRANSPORTING POLYMERS

(75) Inventors: Qing Ye, Mountain View, CA (US); Jie Liu, Niskayuna, NY (US); James Anthony Cella, Clifton Park, NY (US); Eisaku Katoh, Tokyo (JP)

(73) Assignee: General Electric Company, Niskayuna, NY (US)

( * ) Notice: Subject to any disclaimer, the term of this patent is extended or adjusted under 35 U.S.C. 154(b) by 475 days.

(21) Appl. No.: 12/326,115

(22) Filed: Dec. 2, 2008

(65) Prior Publication Data

US 2010/0137538 A1 Jun. 3, 2010

(51) Int. Cl.
*C08F 26/06* (2006.01)
(52) U.S. Cl. .................................. 526/259
(58) Field of Classification Search .......... 526/259
See application file for complete search history.

(56) References Cited

U.S. PATENT DOCUMENTS

| | | |
|---|---|---|
| 7,326,475 B2 | 2/2008 | Katoh et al. |
| 2003/0160260 A1 | 8/2003 | Hirai et al. |
| 2005/0116240 A1 | 6/2005 | Kim et al. |
| 2005/0249970 A1 | 11/2005 | Suzuri et al. |
| 2007/0152573 A1 | 7/2007 | Kim et al. |
| 2008/0088230 A1 | 4/2008 | Suzuri et al. |
| 2008/0238305 A1 | 10/2008 | Kondo et al. |

FOREIGN PATENT DOCUMENTS

| | | |
|---|---|---|
| EP | 1998387 A1 | 12/2008 |
| JP | 2006131783 A | 5/2006 |
| JP | 2006143845 A | 6/2006 |
| JP | 2006120906 A | 11/2006 |
| JP | 2007165377 A | 6/2007 |
| JP | 2008069122 A | 3/2008 |
| JP | 2009059997 A | 3/2009 |
| WO | WO2004095890 A1 | 11/2004 |

OTHER PUBLICATIONS

PCT International Search Report dated Feb. 12, 2010.
PCT International Search Report dated Jul. 20, 2010 and Written Opinion.

*Primary Examiner* — Edward Cain
(74) *Attorney, Agent, or Firm* — Mary Louise Gioeni

(57) ABSTRACT

The invention relates to polymers useful in optoelectronic devices and comprising structural unit of formula I:

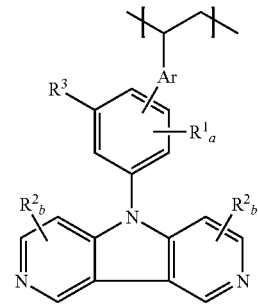

formula I wherein
$R^1$ and $R^2$ are independently at each occurrence, hydrogen, a $C_1$-$C_{20}$ aliphatic radical, a $C_3$-$C_{20}$ aromatic radical, or a $C_3$-$C_{20}$ cycloaliphatic radical;
$R^3$ is H or alkyl;
a and b are, independently at each occurrence 0, or an integer ranging from 1 to 3; and
Ar is a direct bond or aryl.

14 Claims, No Drawings

ELECTRON-TRANSPORTING POLYMERS

BACKGROUND

The invention relates generally to polymers, and particularly to polymers, monomers for preparing the polymers and optoelectronic devices using the polymers, e.g., as electron-transporting materials.

Optoelectronic devices, e.g. Organic Light Emitting Devices (OLEDs), which make use of thin film materials that emit light when subjected to a voltage bias, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs). Due to their high luminous efficiencies, OLEDs are seen as having the potential to replace incandescent, and perhaps even fluorescent, lamps for certain types of applications.

OLEDs possess a sandwiched structure, which consists of one or more organic layers between two opposite electrodes. For instance, multi-layered devices usually comprise at least three layers: a hole injection/transport layer, an emissive layer and an electron transport layer (ETL). Furthermore, it is also preferred that the hole injection/transport layer serves as an electron blocking layer and the ETL as a hole blocking layer. Single-layered OLEDs comprise only one layer of materials between two opposite electrodes.

BRIEF DESCRIPTION

In one aspect, the invention relates to a polymer comprising structural unit of formula I:

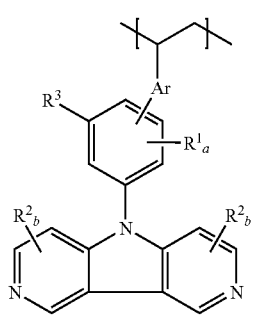

formula I wherein
R$^1$ and R$^2$ are independently at each occurrence, hydrogen, a C$_1$-C$_{20}$ aliphatic radical, a C$_3$-C$_{20}$ aromatic radical, or a C$_3$-C$_{20}$ cycloaliphatic radical;
R$^3$ is H or alkyl;
a and b are, independently at each occurrence 0, or an integer ranging from 1 to 3; and
Ar is a direct bond or aryl.
In yet another aspect, the invention relates to an optoelectronic device comprising a polymer comprising structural unit of formula I.

DETAILED DESCRIPTION

In one aspect, the invention relates to polymers comprising structural unit of formula I. The polymers are prepared by polymerizing monomers or copolymerizing monomers with one or more comonomers to result in copolymers, and combinations thereof, in the form of random, block or graft copolymers, or dendrimers or hyper-branched materials. For example, monomers containing non conductive groups, such as styrenes, (meth)acrylates and vinyl pyridines, can be used as comonomers.

Monomers containing heteroaromatic electron transporting groups, such as phenyl pyridines, triazines, and oxathiazoles, can also be used as comonomers. Examples include vinylphenylpyridine and vinyltriazines described in U.S. Pat. No. 7,056,600.

Monomers containing aromatic and/or heteroaromatic hole transporting groups, such as carbazoles and triarylamines, can also be used as comonomers. Examples include vinylcarbazole and poly (2,7-(9,9-din-octylfluorene)-(1,4-phenylene-((4sec-butylphenyl)imino)-1,4-phenylene)) (TFB), poly(9,9-dioctylfluorene-co-bis-N,N'-(4-butylphenyl)-bis-N,N'-phenyl-1,4-phenylenediamine) (PFB), poly (2,7-(9,9-di-n-octylfluorene)-(1,4-phenylene-((4-methoxyphenyl)imino)-1,4-phenylene-((4-methoxyphenyl)imino)-1,4-phenylene)) (PFMO), poly(9,9'-dioctylfluorene-co-bis-N,N'-(4-butylphenyl)-bis-N,N'-phenylbenzidine (BFE) described in US patent application publication No. US 2007/0241675 published on Oct. 18, 2007 and international patent application publication No. WO 99/54385 published on Oct. 28, 1999.

Monomers containing light emitting groups, for example phosphorescent dyes that exhibits photoluminescence in the visible wavelength region of 400-700 nm, may also be used as comonomers. Examples include polymerizable iridium complexes described in PCT/US07/68620, filed on 7 May 2007 and in international patent application publication No. WO 2007109657 published on Sep. 27, 2007. The light-emitting group may be derived from a vinyl-functional phosphorescent moiety or a vinyl-functional fluorescent moiety.

The invention relates to polymers comprising any single type or combination of light emitting moieties, hole transporting moieties, electron transporting moieties, and less conductive moieties.

In a particular aspect, the invention relates to a polymer of formula II

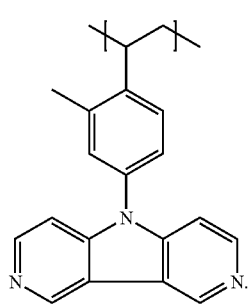

II

In another aspect, the invention relates to a polymer having formula III

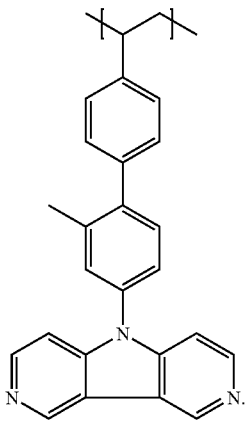

III

In yet another aspect, the invention relates to a polymer having formula IV

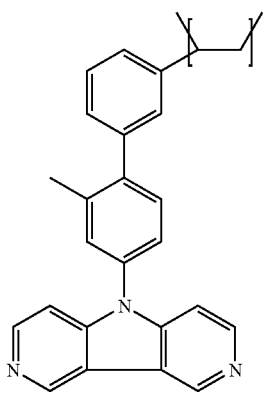

IV

Reaction conditions useful for the preparation of the polymers of the present invention include the use of polar solvents and bases of suitable strength. Exemplary solvents include chloroform, methylene chloride, orthodichlorobenzene, veratrole, anisole, and combinations thereof. Exemplary bases include triethylamine, sodium hydroxide, potassium hydroxide, and combinations thereof. Suitable catalysts may also be employed to effect the polymerization reaction.

In some embodiments, the polymer useful in the invention is a homopolymer. In other embodiments, the polymer is a copolymer and additionally includes less conductive moieties, hole transporting moieties, electron transporting moieties, light emitting moieties and combinations thereof. The copolymer may be a block copolymer, a random copolymer, an alternating copolymer, or a graft copolymer. The different kinds of copolymers may be obtained by the appropriate choice of monomers, reaction conditions such as initiators, temperature, and/or solvent. Polymers useful in the invention may be made by the polymerization of monomers effected by initiators that include free radical initiators, cationic initiators, anionic initiators, and the like. Polymerization may be effected in the bulk state, in solution using a suitable solvent, or in an appropriate suspension or emulsion state. In one particular embodiment, the polymerization is effected using free radical initiators such as azobisisobutyronitrile in a dipolar solvent such as DMF or NMP.

Methods for polymerizing vinyl monomers are well known in the art. In certain embodiments, the polymerization reaction may be conducted at a temperature that ranges from about −50° C. to about 100° C. The polymerization may also be conducted at atmospheric pressure, subatmospheric pressures, or superatmospheric pressures. The polymerization reaction is conducted for a time period necessary to achieve polymer of a suitable molecular weight. The molecular weight of a polymer is determined by any of the techniques known to those skilled in the art, and include viscosity measurements, light scattering, osmometry, and the like. The molecular weight of a polymer is typically represented as a number average molecular weight $M_n$, or weight average molecular weight, $M_w$. A particularly useful technique to determine molecular weight averages is gel permeation chromatography (GPC), from wherein both number average and weight average molecular weights are obtained. In some embodiments, it is desirable that $M_w$ of the polymer is sufficiently high to allow film formation, typically greater than about 5,000 grams per mole (g/mol) is desirable, in other embodiments, polymers of $M_n$ greater than 30,000 g/mol is desirable, while in yet other embodiments, polymer of $M_n$ greater than 70,000 g/mol is desirable. $M_w$ is determined using polystyrene as standard.

Polymers useful in the invention can also be synthesized by post functionalization. For example the same polymer structure can be realized by carrying on Suzuki coupling reaction between bromostyrene and appropriate structures bearing boronic ester or boronic acid moieties.

An optoelectronic device, e.g., an OLED, typically includes in the simplest case, an anode layer and a corresponding cathode layer with an organic electroluminescent layer disposed between said anode and said cathode. When a voltage bias is applied across the electrodes, electrons are injected by the cathode into the electroluminescent layer while electrons are removed from (or "holes" are "injected" into) the electroluminescent layer from the anode. Light emission occurs as holes combine with electrons within the electroluminescent layer to form singlet or triplet excitons, light emission occurring as singlet excitons transfer energy to the environment by radiative decay.

Other components which may be present in an optical electronic device in addition to the anode, cathode and light emitting material include hole injection layers, electron injection layers, and electron transporting layers. The electron transporting layer need not be in contact with the cathode, and frequently the electron transporting layer is not an efficient hole transporter and thus it serves to block holes migrating toward the cathode. During operation of an organic light emitting device comprising an electron transporting layer, the majority of charge carriers (i.e. holes and electrons) present in the electron transporting layer are electrons and light emission can occur through recombination of holes and electrons present in the electron transporting layer. Additional components which may be present in an organic light emitting device include hole transporting layers, hole transporting emission (emitting) layers and electron transporting emission (emitting) layers.

Polymers comprising structural unit of formula I have suitable properties useful in applications such as optoelectronic devices, e.g., organic light emitting devices (OLEDs). The polymers of the present invention are particularly well suited for use in both multi-layered OLEDs and single-layered OLEDs. The OLEDs comprising the polymers of the invention may be a phosphorescent OLED containing one or more, any or a combination of blue, yellow, orange, green and red phosphoresce dyes. Polymers of the present invention can be part of emissive layer, or hole transporting layer or electron transporting layer, or electron injection layer of OLEDS or any combination thereof.

The organic electroluminescent layer, i.e., the emissive layer, is a layer within an organic light emitting device which when in operation contains a significant concentration of both electrons and holes and provides sites for exciton formation and light emission. A hole injection layer is a layer in contact with the anode which promotes the injection of holes from the anode into the interior layers of the OLED; and an electron injection layer is a layer in contact with the cathode that promotes the injection of electrons from the cathode into the OLED; an electron transporting layer is a layer which facilitates conduction of electrons from cathode to a charge recombination site. The electron transporting layer need not be in contact with the cathode, and frequently the electron transporting layer is not an efficient hole transporter and thus it serves to block holes migrating toward the cathode. During operation of an organic light emitting device comprising an electron transporting layer, the majority of charge carriers (i.e. holes and electrons) present in the electron transporting layer are electrons and light emission can occur through recombination of holes and electrons present in the electron transporting layer. A hole transporting layer is a layer which when the OLED is in operation facilitates conduction of holes from the anode to charge recombination sites and which need not be in contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. An electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode include materials having a bulk resistivity of preferred about 1000 ohms per square or less, as measured by a four-point probe technique. Indium tin oxide (ITO) is frequently used as the anode because it is substantially transparent to light transmission and thus facilitates the escape of light emitted from electroactive organic layer. Other materials which may be utilized as the anode layer include tin oxide, indium oxide, zinc oxide, indium zinc oxide, zinc indium tin oxide, antimony oxide, and mixtures thereof.

Materials suitable for use as the cathode include by zero valent metals which can inject negative charge carriers (electrons) into the inner layer(s) of the OLED. Various zero valent metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a zero valent metal, such as aluminum or silver. In particular, the cathode may be composed of a single zero valent metal, and especially of aluminum metal.

The invention relates to polymers which may be used in electron transporting layers in place of, or in addition to traditional materials such as poly(9,9-dioctyl fluorene), tris (8-hydroxyquinolato) aluminum ($Alq_3$), 2,9-dimethyl-4,7-diphenyl-1,1-phenanthroline, 4,7-diphenyl-1,10-phenanthroline, 2-(4-biphenylyl)-5-(4-t-butylphenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

Materials suitable for use in hole transporting layers include 1,1-bis((di-4-tolylamino)phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, phenyl-4-N,N-diphenylaminostyrene, p-(diethylamino) benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis (4-methylphenyl)-(1,1'-biphenyl)-4,4'-diamine, copper phthalocyanine, polyvinylcarbazole, (phenylmethyl)polysilane; poly(3,4-ethylendioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371. The invention relates to polymers which may be used in place of, or in addition to aforementioned materials.

Materials suitable for use in the light emitting layer include electroluminescent polymers such as polyfluorenes, preferably poly(9,9-dioctyl fluorene) and copolymers thereof, such as poly(9,9'-dioctylfluorene-co-bis-N,N'-(4-butylphenyl) diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available electrofluorescent and electrophosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

In one aspect, polymers comprising structural unit of formula I may form part of the electron transporting layer or electron injection layer or hole transporting layer or light emissive layer. Thus, in one aspect, the present invention relates to more efficient optical electronic devices, e.g., OLEDs comprising polymers comprising structural unit of formula I. The OLEDs may be phosphorescent containing one or more, any or a combination of, blue, yellow, orange, green and red phosphorescent dyes.

DEFINITIONS

As used herein, the term "aromatic radical" refers to an array of atoms having a valence of at least one comprising at least one aromatic group. The array of atoms having a valence of at least one comprising at least one aromatic group may include heteroatoms such as nitrogen, sulfur, selenium, silicon and oxygen, or may be composed exclusively of carbon and hydrogen. As used herein, the term "aromatic radical" includes but is not limited to phenyl, pyridyl, furanyl, thienyl, naphthyl, phenylene, and biphenyl radicals. As noted, the aromatic radical contains at least one aromatic group. The aromatic group is invariably a cyclic structure having 4n+2 "delocalized" electrons where "n" is an integer equal to 1 or greater, as illustrated by phenyl groups (n=1), thienyl groups (n=1), furanyl groups (n=1), naphthyl groups (n=2), azulenyl groups (n=2), and anthraceneyl groups (n=3). The aromatic radical may also include nonaromatic components. For example, a benzyl group is an aromatic radical which comprises a phenyl ring (the aromatic group) and a methylene group (the nonaromatic component). Similarly a tetrahydronaphthyl radical is an aromatic radical comprising an aromatic group ($C_6H_3$) fused to a nonaromatic component —$(CH_2)_4$—. For convenience, the term "aromatic radical" is defined herein to encompass a wide range of functional groups such as alkyl groups, alkenyl groups, alkynyl groups, haloalkyl groups, haloaromatic groups, conjugated dienyl groups, alcohol groups, ether groups, aldehydes groups, ketone groups, carboxylic acid groups, acyl groups (for example carboxylic acid derivatives such as esters and amides), amine groups, nitro groups, and the like. For example, the 4-methylphenyl radical is a $C_7$ aromatic radical comprising a methyl group, the methyl group being a functional group which is an alkyl group. Similarly, the 2-nitrophenyl group is a $C_6$ aromatic radical comprising a nitro group, the nitro group being a functional group. Aromatic radicals include halogenated aromatic radicals such as 4-trifluoromethylphenyl, hexafluoroisopropylidenebis(4-phen-1-yloxy) (i.e., —$OPhC(CF_3)_2PhO$—), 4-chloromethylphen-1-yl, 3-trifluorovinyl-2-thienyl, 3-trichloromethylphen-1-yl (i.e., 3-$CCl_3Ph$-), 4-(3-bromoprop-1-yl)phen-1-yl (i.e., 4-$BrCH_2CH_2CH_2Ph$-), and the like. Further examples of aromatic radicals include 4-allyloxyphen-1-oxy, 4-aminophen-1-yl (i.e., 4-$H_2NPh$-), 3-aminocarbonylphen-1-yl (i.e., $NH_2COPh$-), 4-benzoylphen-1-yl, dicyanomethylidenebis (4-phen-1-yloxy) (i.e., —$OPhC(CN)_2PhO$—), 3-methylphen-1-yl, methylenebis(4-phen-1-yloxy) (i.e., —$OPhCH_2PhO$—), 2-ethylphen-1-yl, phenylethenyl, 3-formyl-2-thienyl, 2-hexyl-5-furanyl, hexamethylene-1,6-bis(4-phen-1-yloxy) (i.e., —$OPh(CH_2)_6PhO$—), 4-hydroxymethylphen-1-yl (i.e., 4-$HOCH_2Ph$-), 4-mercaptomethylphen-1-yl (i.e., 4-$HSCH_2Ph$-), 4-methylthiophen-1-yl (i.e., 4-$CH_3SPh$-), 3-methoxyphen-1-yl, 2-methoxycarbonylphen-1-yloxy (e.g. methyl salicyl), 2-nitromethylphen-1-yl (i.e., 2-$NO_2CH_2Ph$), 3-trimethylsilylphen-1-yl, 4-t-butyldimethylsilylphenl-1-yl, 4-vinylphen-1-yl, vinylidenebis (phenyl), and the like. The term "a $C_3$-$C_{20}$ aromatic radical" includes aromatic radicals containing at least three but no more than 20 carbon atoms. The aromatic radical 1-imidazolyl ($C_3H_2N_2$—) represents a $C_3$ aromatic radical. The benzyl radical ($C_7H_7$—) represents a $C_7$ aromatic radical.

As used herein the term "cycloaliphatic radical" refers to a radical having a valence of at least one, and comprising an array of atoms which is cyclic but which is not aromatic. As defined herein a "cycloaliphatic radical" does not contain an aromatic group. A "cycloaliphatic radical" may comprise one or more noncyclic components. For example, a cyclohexylmethyl group ($C_6H_{11}CH_2$—) is an cycloaliphatic radical which comprises a cyclohexyl ring (the array of atoms which is cyclic but which is not aromatic) and a methylene group (the noncyclic component). The cycloaliphatic radical may include heteroatoms such as nitrogen, sulfur, selenium, silicon and oxygen, or may be composed exclusively of carbon and hydrogen. For convenience, the term "cycloaliphatic radical" is defined herein to encompass a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylcyclopent-1-yl radical is a $C_6$ cycloaliphatic radical comprising a methyl group, the methyl group being a functional group which is an alkyl group. Similarly, the 2-nitrocyclobut-1-yl radical is a $C_4$ cycloaliphatic radical comprising a nitro group, the nitro group being a functional group. A cycloaliphatic radical may comprise one or more halogen atoms which may be the same or different. Halogen atoms include, for example; fluorine, chlorine, bromine, and iodine. Cycloaliphatic radicals comprising one or more halogen atoms include 2-trifluoromethylcyclohex-1-yl, 4-bromodifluoromethylcyclooct-1-yl, 2-chlorodifluoromethylcyclohex-1-yl, hexafluoroisopropylidene-2,2-bis(cyclohex-4-yl) (i.e., —$C_6H_{10}C(CF_3)_2C_6H_{10}$—), 2-chloromethylcyclohex-1-yl, 3-difluoromethylenecyclohex-1-yl, 4-trichloromethylcyclohex-1-yloxy, 4-bromodichloromethylcyclohex-1-ylthio, 2-bromoethylcyclopent-1-yl, 2-bromopropylcyclohex-1-yloxy (e.g. $CH_3CHBrCH_2C_6H_{10}O$—), and the like. Further examples of cycloaliphatic radicals include 4-allyloxycyclohex-1-yl, 4-aminocyclohex-1-yl (i.e., $H_2NC_6H_{10}$—), 4-aminocarbonylcyclopent-1-yl (i.e., $NH_2COC_5H_8$—), 4-acetyloxycyclohex-1-yl, 2,2-dicyanoisopropylidenebis(cyclohex-4-yloxy) (i.e., —$OC_6H_{10}C(CN)_2C_6H_{10}O$—), 3-methylcyclohex-1-yl, methylenebis(cyclohex-4-yloxy) (i.e., —$OC_6H_{10}CH_2C_6H_{10}O$—), 1-ethylcyclobut-1-yl, cyclopropylethenyl, 3-formyl-2-terahydrofuranyl, 2-hexyl-5-tetrahydrofuranyl, hexamethylene-1,6-bis(cyclohex-4-yloxy) (i.e., —$OC_6H_{10}(CH_2)_6C_6H_{10}O$—), 4-hydroxymethylcyclohex-1-yl (i.e., 4-$HOCH_2C_6H_{10}$—), 4-mercaptomethylcyclohex-1-yl (i.e., 4-$HSCH_2C_6H_{10}$—), 4-methylthiocyclohex-1-yl (i.e., 4-$CH_3SC_6H_{10}$—), 4-methoxycyclohex-1-yl, 2-methoxycarbonylcyclohex-1-yloxy (2-$CH_3OCOC_6H_{10}O$—), 4-nitromethylcyclohex-1-yl (i.e., $NO_2CH_2C_6H_{10}$—), 3-trimethylsilylcyclohex-1-yl, 2-t-butyldimethylsilylcyclopent-1-yl, 4-trimethoxysilylethylcyclohex-1-yl (e.g. ($CH_3O)_3SiCH_2CH_2C_6H_{10}$—), 4-vinylcyclohexen-1-yl, vinylidenebis (cyclohexyl), and the like. The term "a $C_3$-$C_{10}$ cycloaliphatic radical" includes cycloaliphatic radicals containing at least three but no more than 10 carbon atoms. The cycloaliphatic radical 2-tetrahydrofuranyl ($C_4H_7O$—) represents a $C_4$ cycloaliphatic radical. The cyclohexylmethyl radical ($C_6H_{11}CH_2$—) represents a $C_7$ cycloaliphatic radical.

As used herein the term "aliphatic radical" refers to an organic radical having a valence of at least one consisting of a linear or branched array of atoms which is not cyclic. Aliphatic radicals are defined to comprise at least one carbon atom. The array of atoms comprising the aliphatic radical may include heteroatoms such as nitrogen, sulfur, silicon, selenium and oxygen or may be composed exclusively of carbon and hydrogen. For convenience, the term "aliphatic radical" is defined herein to encompass, as part of the "linear or branched array of atoms which is not cyclic" organic radicals substituted with a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylpent-1-yl radical is a $C_6$ aliphatic radical comprising a methyl group, the methyl group being a functional group which is an alkyl group. Similarly, the 4-nitrobut-1-yl group is a $C_4$ aliphatic radical comprising a nitro group, the nitro group being a functional group. An aliphatic radical may be a haloalkyl group which comprises one or more halogen atoms which may be the same or different. Halogen atoms include, for example; fluorine, chlorine, bromine, and iodine. Aliphatic radicals comprising one or more halogen atoms include the alkyl halides trifluoromethyl, bromodifluoromethyl, chlorodifluoromethyl, hexafluoroisopropylidene, chloromethyl, difluorovinylidene, trichloromethyl, bromodichloromethyl, bromoethyl, 2-bromotrimethylene (e.g. —CH$_2$CHBrCH$_2$—), and the like. Further examples of aliphatic radicals include allyl, aminocarbonyl (i.e., —CONH$_2$), carbonyl, 2,2-dicyanoisopropylidene (i.e., —CH$_2$C(CN)$_2$CH$_2$—), methyl (i.e., —CH$_3$), methylene (i.e., —CH$_2$—), ethyl, ethylene, formyl (i.e. —CHO), hexyl, hexamethylene, hydroxymethyl (i.e. —CH$_2$OH), mercaptomethyl (i.e., —CH$_2$SH), methylthio (i.e., —SCH$_3$), methylthiomethyl (i.e., —CH$_2$SCH$_3$), methoxy, methoxycarbonyl (i.e., CH$_3$OCO—), nitromethyl (i.e., —CH$_2$NO$_2$), thiocarbonyl, trimethylsilyl (i.e. (CH$_3$)$_3$Si—), t-butyldimethylsilyl, 3-trimethyoxysilypropyl (i.e., (CH$_3$O)$_3$SiCH$_2$CH$_2$CH$_2$—), vinyl, vinylidene, and the like. By way of further example, a C$_1$-C$_{10}$ aliphatic radical contains at least one but no more than 10 carbon atoms. A methyl group (i.e., CH$_3$—) is an example of a C$_1$ aliphatic radical. A decyl group (i.e., CH$_3$(CH$_2$)$_9$—) is an example of a C$_{10}$ aliphatic radical.

The term "aryl" is used herein to refer to an aromatic substituent which may be a single aromatic ring or multiple aromatic rings which are fused together, linked covalently, or linked to a common group such as an ether, methylene or ethylene moiety. The aromatic ring(s) may include phenyl, naphthyl, anthracenyl, and biphenyl, among others. In particular embodiments, aryls have between 1 and 200 carbon atoms, between 1 and 50 carbon atoms or between 1 and 20 carbon atoms.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

EXAMPLES

Examples 1-6 describe the synthesis of polymers of the invention and intermediates used in making them. All reagents are purchased from Aldrich Chemical Co., Milwaukee, Wis., USA and are used as received unless otherwise specified. 2-Dicyclohexylphosphino-2',6'-dimethoxybiphenyl was recrystallized from acetone prior to use. Anhydrous solvents were used right after received and stored in a nitrogen purge glove box after being used. All compounds are characterized by $^1$H-NMR and found to correspond to the structures shown.

General Methods

Molecular weight data was obtained using Perkin Elmer GPC Series 200 with UV/VIS Detector, Polymer Laboratories PLGel 5 mm column, chloroform with 3.75% IPA as elute or THF as elute and polystyrene standards as the calibration standards. NMR spectra are measured on a Bruker 400 or Bruker Advance 500 spectrometers and referenced versus residual solvent shifts.

Example 1

Synthesis of Polymer of Formula II

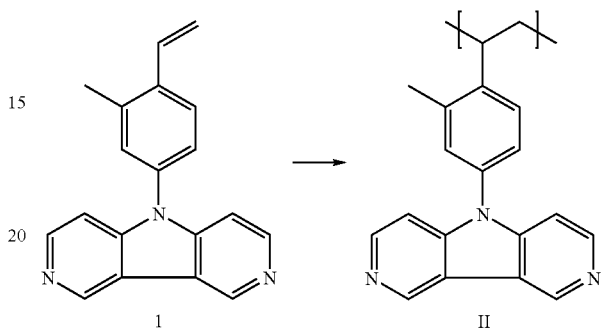

Compound 1 (0.3 g) was dissolved into 2 mL of NMP. After the monomer (compound 1) is completely dissolved, 10 uL of AIBN (0.05 g/mL in NMP) was added using a micro syringe. The solution was transferred to a schlenk tube with a spin bar on the bottom. 1 mL of solvent was used to assist transfer and rinse the flask. The schlenk tube was degassed by freeze-thaw cycle 3 times, and then placed in an oil bath, heated at 70° C. for 48 hours. The reaction mixture was cooled to room temperature; The polymer solution was precipitated into 20 mL of methanol and collected using fine frit funnel using suction filtration. After drying in nitrogen purged gloved box overnight, the polymer weight was taken (0.08 g) and light scattering GPC suggest it Mw=81 k.

Example 2

Synthesis of Compound 1

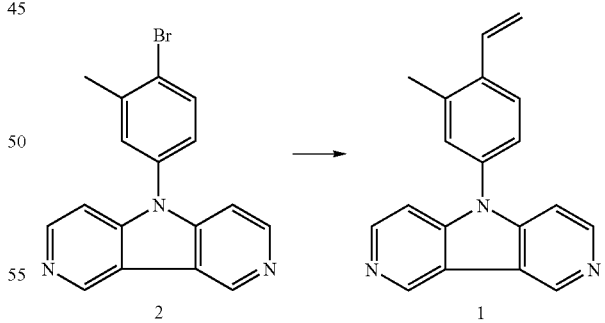

Compound 2 (0.338 g) and 0.1 g of Vinylboronic anhydride pyridine complex were weighed out into a 250 mL of three-neck round bottom flask equipped with an condenser and argon inlet. To this flask, 10 mL of aqueous K$_2$CO$_3$ (2 N) was added, along with 10 mL of reagent grade dioxane. The reaction flask was evacuated with argon three times before a small pinch of Pd(PPh$_3$)$_4$ was added. The reaction mixture was heated to 80° C. After an hour under argon, all the bromide was converted according to $^1$H NMR spectroscopy.

The mixture was transferred to a round bottom flask and solvent was removed. To the residue, water and CH₂Cl₂ (1:1, 20 mL) was added and stirred until all the residues were dissolved. Then water and organic layers was separated. Organic layers was further washed with water (10 mL) and brine (10 mL), and dried over Na₂SO₄ for half an hour. The solvent was removed using roto-evaporation, afforded the crude product.

Example 3

Synthesis of Polymer of Formula III

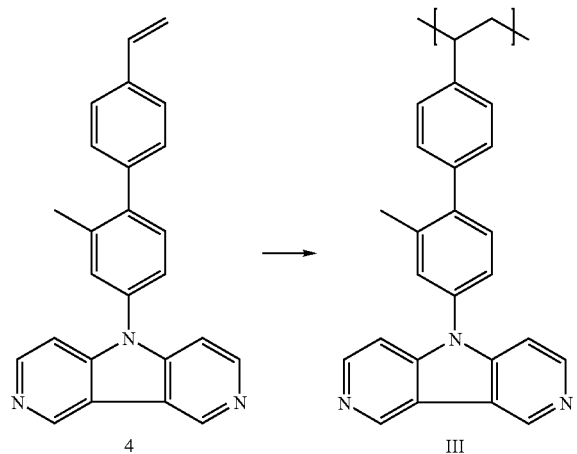

Compound 4 (0.3 g) was dissolved into 2 mL of NMP. After the monomer (compound 4) is completely dissolved, 10 uL of AIBN (0.05 g/mL in NMP) was added using a micro syringe. The solution was transferred to a schlenk tube with a spin bar on the bottom. 1 mL of solvent was used to assist transfer and rinse the flask. The schlenk tube was degassed by frozen-thaw cycle 3 times, and then placed in an oil bath, heated at 70° C. for 48 hours. The reaction mixture was cooled to room temperature; The polymer solution was precipitated into 20 mL of methanol and collected using fine frit funnel using suction filtration. After drying in nitrogen purged gloved box overnight, the polymer weight was taken (0.13 g) and light scattering GPC suggest it Mw=116 k.

Example 4

Synthesis of Compound 4

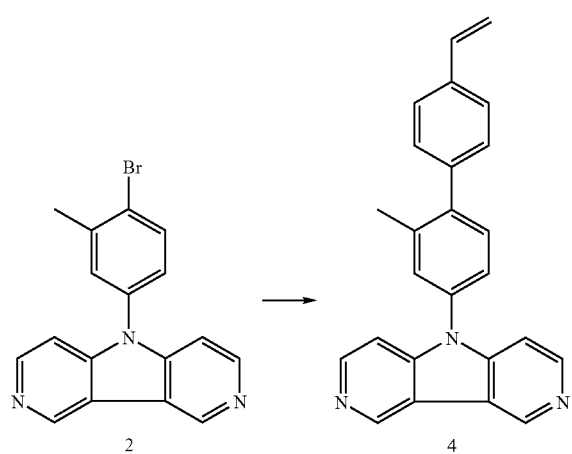

Compound 2 (1.3194 g) and 0.693 g of vinylphenyl boronic acid were weighed out into a 250 mL of three-neck round bottom flask equipped with an condenser and argon inlet. To this flask, 40 mL of aqueous K₂CO₃ (2N) was added, along with 40 mL of reagent grade dioxane. The reaction flash was evacuated with argon three times before a small pinch of Pd(PPh₃)₄ was added. The reaction mixture was heated to 80° C. After an hour under argon, all the bromide was converted according to ¹H NMR spectroscopy. The mixture was transferred to a round bottom flask and solvent was removed. To the residue, water and CH₂Cl₂ (1:1, 80 mL) was added and stirred until all the residues were dissolved. Then water and organic layers was separated. Organic layers was further washed with water (40 mL) and brine (40 mL), and dried over Na₂SO₄ for half an hour. The solvent was removed using roto-evaporation, afforded the crude product. ¹H NMR (δ CDCl₃) 9.44 (s, 2H), 8.59 (d, 2H), 7.63 (dd, 1H), 7.51 (d, 2H), 7.47 (d, 1H), 7.44 (dd, 1H), 7.41 (dd, 3H) 7.36 (td, 3H), 6.77 (dd, 1H), 5.81 (d, 1H), 5.30 (d, 1H), 2.38 (s, 3H).

Example 5

Synthesis of Polymer of Formula IV

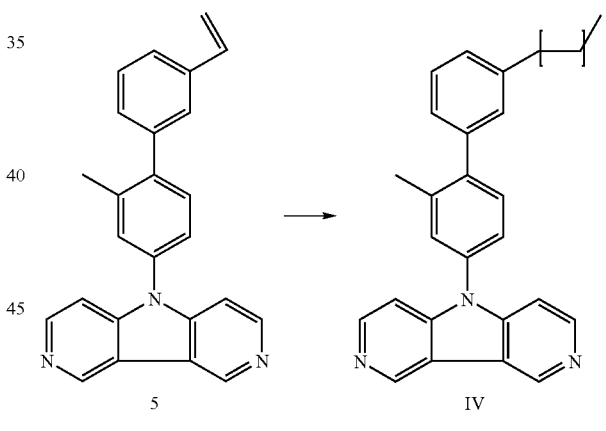

Compound 5 (0.2 g) was dissolved into 2 mL of NMP. After the monomer is completely dissolved, 10 uL of AIBN (0.05 g/mL in NMP) was added using a micro syringe. The solution was transferred to a schlenk tube with a spin bar on the bottom. 1 mL of solvent was used to assist transfer and rinse the flask. The schlenk tube was degassed by frozen-thaw cycle 3 times, and then placed in an oil bath, heated at 72° C. for 48 hours. The reaction mixture was cooled to room temperature; The polymer solution was precipitated into 20 mL of methanol and collected using fine frit funnel using suction filtration. After drying in nitrogen purged gloved box overnight, the polymer weight was taken (0.05 g) and light scattering GPC suggest it Mw=45 k.

Example 6

Synthesis of Compound 5

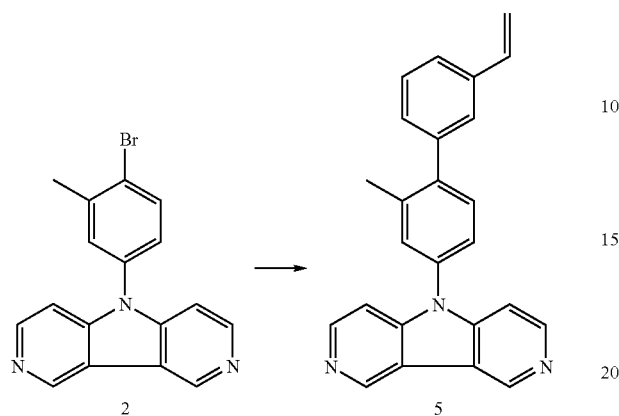

Compound 2 (0.338 g) and 0.1683 g of 3-vinylphenyl boronic acid were weighed out into a 250 mL of three-neck round bottom flask equipped with an condenser and argon inlet. To this flask, 10 mL of aqueous $K_2CO_3$ (2 N) was added, along with 10 mL of reagent grade dioxane. The reaction flash was evacuated with argon three times before a small pinch of $Pd(PPh_3)_4$ was added. The reaction mixture was heated to 80° C. After an hour under argon, all the bromide was converted according to $^1H$ NMR spectroscopy. The mixture was transferred to a round bottom flask and solvent was removed. To the residue, water and $CH_2Cl_2$ (1:1, 20 mL) was added and stirred until all the residues were dissolved. Then water and organic layers was separated. Organic layers was further washed with water (10 mL) and brine (10 mL), and dried over $Na_2SO_4$ for half an hour. The solvent was removed using roto-evaporation, afforded the crude product. $^1H$ NMR (δ $CDCl_3$) 9.47 (s, 2H), 8.62 (d, 2H), 7.51 (d, 1H), 7.46 (d, 3H), 7.44 (d, 3H), 7.40 (dd, 1H), 7.31 (td, 1H), 6.80 (d, 1H), 5.83 (d, 1H), 5.34 (d, 1H), 2.38 (s, 3H).

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A polymer comprising structural units of formula I:

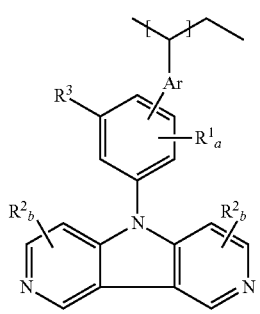

formula I wherein
$R^1$ and $R^2$ are independently at each occurrence, hydrogen, a $C_1$-$C_{20}$ aliphatic radical, a $C_3$-$C_{20}$ aromatic radical, or a $C_3$-$C_{20}$ cycloaliphatic radical;
$R^3$ is H or alkyl;
a and b are, independently at each occurrence 0, or an integer ranging from 1 to 3; and
Ar is a direct bond or aryl.

2. The polymer of claim 1, being of formula

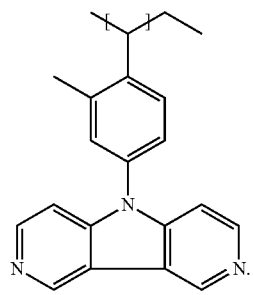

3. The polymer of claim 1, being of formula

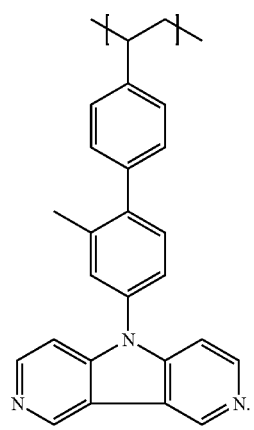

4. The polymer of claim 1, being of formula

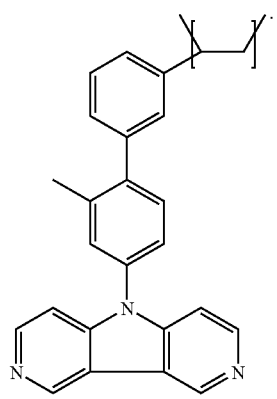

5. The polymer of claim 1, additionally comprising structural units comprising at least one light emitting group that exhibits photoluminescence in the visible wavelength region of 400-700 nm.

6. The polymer of claim 5, wherein the at least one light emitting group comprises a vinyl-functional phosphorescent moiety.

7. The polymer of claim 5, wherein the at least one light emitting group comprises a vinyl-functional fluorescent moiety.

8. An optical electronic device comprising a polymer comprising structural units of formula I

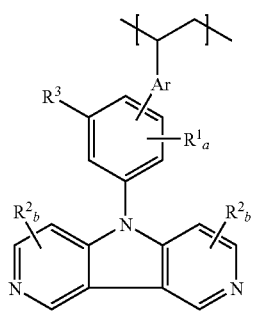

formula I wherein

R$^1$ and R$^2$ are independently at each occurrence, hydrogen, a C$_1$-C$_{20}$ aliphatic radical, a C$_3$-C$_{20}$ aromatic radical, or a C$_3$-C$_{20}$ cycloaliphatic radical;

R$^3$ is H or alkyl;

a and b are, independently at each occurrence 0, or an integer ranging from 1 to 3; and Ar is a direct bond or aryl.

9. The optoelectronic device of claim 8, comprising one or more fluorescent emissive materials.

10. The optoelectronic device of claim 8, comprising one or more phosphorescent emissive materials.

11. The optoelectronic device of claim 8, comprising one or more, any or a combination of blue, yellow, orange, green and red phosphorenscent dyes.

12. The optoelectronic device of claim 8, wherein the polymer is of formula

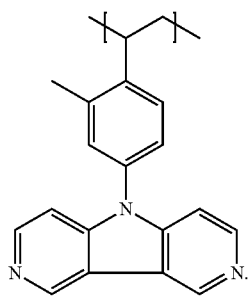

13. The optoelectronic device of claim 8, wherein the polymer is of formula

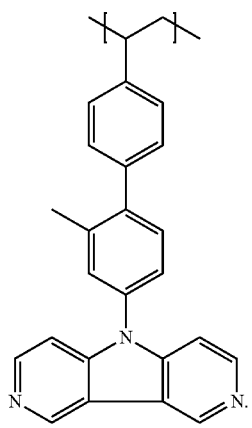

14. The optoelectronic device of claim 8, wherein the polymer is of formula

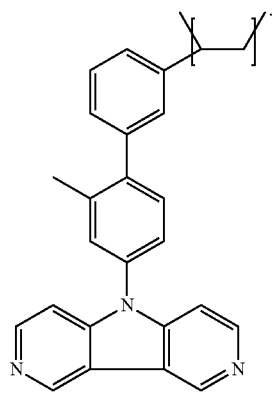

* * * * *